United States Patent [19]

Eberhardt et al.

[11] Patent Number: 5,570,066

[45] Date of Patent: Oct. 29, 1996

[54] METHOD OF PROGRAMMING A FREQUENCY SYNTHESIZER

[75] Inventors: John E. Eberhardt, Alpharetta; Ronald L. Bane, Stone Mountain, both of Ga.

[73] Assignee: Motorola, Inc., Schaumburg, Ill.

[21] Appl. No.: 298,492

[22] Filed: Aug. 30, 1994

[51] Int. Cl.[6] .................. H03L 7/00; H04B 1/06
[52] U.S. Cl. .................. 331/34; 331/18; 327/106; 455/260
[58] Field of Search .................. 375/120, 119, 375/97; 331/1 R, 25, 1 A, 23, 2, 16, 18, 34; 327/156, 162; 455/260, 265, 183.2; 348/731, 732, 733, 735; 84/672, DIG. 18, 454

[56] References Cited

U.S. PATENT DOCUMENTS

| | | |
|---|---|---|
| 4,290,029 | 8/1981 | Streckenbach .................. 331/1 A |
| 4,320,357 | 3/1982 | Wulfsberg et al. .................. 331/16 |
| 4,442,413 | 4/1984 | Hayashida et al. .................. 348/735 |
| 4,485,404 | 11/1984 | Tults .................. 348/735 |
| 4,568,888 | 2/1986 | Kimura et al. .................. 331/10 |
| 4,940,950 | 7/1990 | Heffrick .................. 331/2 |
| 4,993,048 | 2/1991 | Williams et al. .................. 375/97 |
| 5,152,005 | 9/1992 | Bickley .................. 455/260 |
| 5,301,366 | 4/1994 | Groshong et al. .................. 455/260 |
| 5,319,681 | 6/1994 | Meyer .................. 375/119 |
| 5,420,545 | 5/1995 | Davis et al. .................. 331/16 |

*Primary Examiner*—Wellington Chin
*Assistant Examiner*—Paul Loomis
*Attorney, Agent, or Firm*—Kenneth M. Massaroni

[57] ABSTRACT

In order to program the output frequency of a synthesizer such as that of a two-way radio, first the reference oscillator is warped or tuned substantially to one limit of its tuning range. The "N" divisor of the synthesizer dividor is then selected to produce a loop output close to the desired loop output frequency. The reference oscillator is then tuned to provide the desired loop output frequency.

4 Claims, 1 Drawing Sheet

METHOD OF PROGRAMMING A FREQUENCY SYNTHESIZER

TECHNICAL FIELD

This invention relates in general to frequency synthesizers in general and particularly to methods of calibrating a frequency synthesizer.

BACKGROUND

In a typical frequency synthesizer, such as the circuit illustrated in FIG. 1, the output frequency of a reference oscillator 20 is calibrated or tuned to a predetermined value. A desired output frequency is then produced by adjusting the "N" value of the divide-by-N divider 13 in the synthesizer loop 11. The N value can be mathematically determined simply since the reference oscillator frequency is predetermined. When utilizing this approach, it is necessary that the crystal oscillator 20 be capable of being tuned to this predetermined value. Crystals are subject to variations in tolerance due to manufacturing processes, as well as aging and temperature effects. For example, a reference crystal with a nominal frequency of 10.240 MHz can have a minimum pullability or adjustment of 15 parts per million (PPM) per picofarad (pF). This translates to a maximum of 22 KHz at a transmit frequency of 433.92 MHz when a tuning varactor is moved 3.4 PF. If the synthesizer is used in a transmitter that is frequency modulated, the varactor 26 can be modulated by varying the voltage applied to the varactor 26, thereby providing a varying capacitance and the FM modulation. At 423.225 MHz, the local oscillator (LO) frequency for the receiver, the pullability is 21.6 KHz. This would make the tolerance of the crystal 20 PPM, which combined with a 10 PPM temperature tolerance and 23 PPM aging tolerance totals 53 PPM or 24 KHz at 433.92 MHz. In this application, a tighter crystal specification would be needed (at a higher cost), if the reference oscillator were tuned by the varactor only. A tuning approach that permits the use of a less precise and less expensive crystal while permitting tuning operation of the frequency synthesizer to produce a desired output would be desirable.

SUMMARY OF THE INVENTION

Briefly, according to the invention, there is provided a method of tuning a frequency synthesizer by adjusting the loop divider until the output frequency is close to the desired frequency. The reference oscillator is then adjusted to produce the desired synthesizer output frequency.

DETAILED DESCRIPTION OF THE PREFERRED EMBODIMENT

Figure 1:
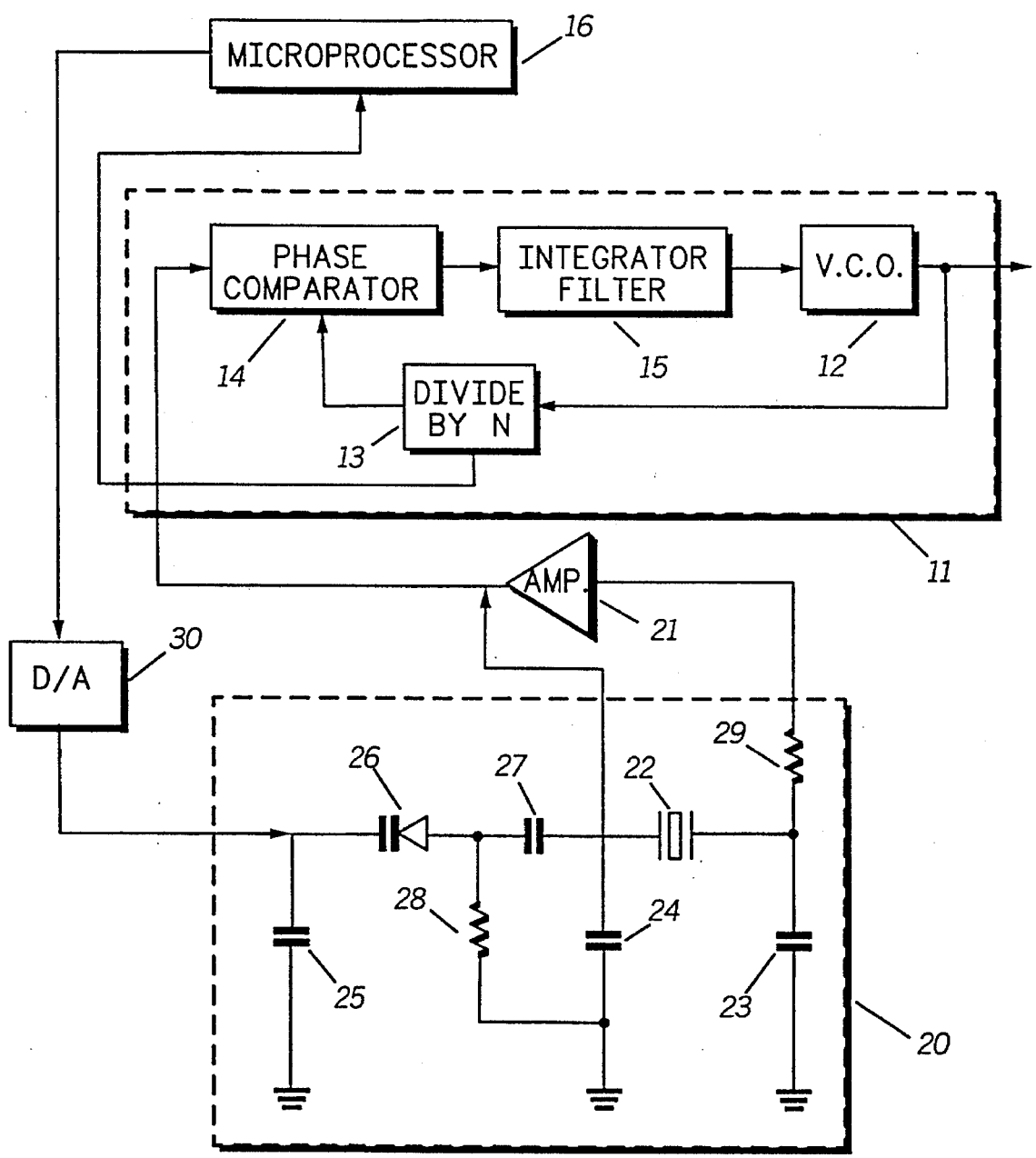
FIG. 1 is a block diagram of a microprocessor controlled frequency synthesizer that can be utilized in accordance with the present invention.

The method of programming a frequency synthesizer or a radio having a synthesizer can be best understood by review of FIG. 1, which illustrates a substantially conventional frequency synthesizer 10. The frequency synthesizer 10 includes a synthesizer loop 11, having a conventional voltage control oscillator 12, divide-by-N loop divider 13, phase comparator 14, and integrator/filter 15, which serves as a loop filter. The N value of the loop divider 13 is provided, as by a controller such as microprocessor 16. The reference signal is provided to comparator 14 as by reference oscillator 20 and amplifier 21. If desired, the amplifier 21 can be included on a single integrated circuit with components of the synthesizer loop 11.

Reference oscillator 20 includes a crystal 22, a load circuit composed of capacitors 23, 24, 25, and a varactor or variable capacitor 26. A coupling or DC blocking capacitor 27 couples varactor 26 to crystal 22, while resistors 28 and 29 are used for DC biasing purposes. A DC voltage is derived from an output of microprocessor 16 by a digital-to-analog converter (D/A) 30, which can be a simple, discrete D/A implementation in the preferred implementation. The DC voltage from D/A 30 is applied to the varactor 26 to change the capacitance of the varactor 26 and thereby pull or warp the output frequency of crystal 22. It should be understood that the specific illustrated reference oscillator topology and loop topology are not critical and other circuit topologies can be utilized with this method. Tuning values can be stored in a memory such as an EEPROM 17 associated with microprocessor 16. Since the crystal 22 is not necessarily a high precision crystal, the varactor 26 may not be capable of pulling the crystal 22 to a desired nominal oscillator frequency.

To program a desired VCO output frequency for applications such as a radio transmitter or receiver, the synthesizer loop 11 is coarse tuned by adjusting the divisor "N" of the loop divider 13 until the output frequency is close to the desired output frequency. The reference oscillator 20 is then adjusted by tuning the value applied to D/A 30 and consequently, the analog voltage applied to varactor 26, until a desired VCO output frequency has been obtained. The coarse and fine tuning values for this particular output frequency can then be stored. Additional VCO output frequencies can be determined and stored in a similar manner, as, for example, a transmit or receive frequency that is offset from the other frequency, or another channel for a radio. Preferably, the varactor 26 is tuned towards one limit of its tuning range by D/A 30 prior to tuning the divider 13. Divider 13 is then tuned (by selecting values of "N") until it is within tuning range of the varactor 26. The input to D/A 30 is then changed to tune the varactor 26 to warp the crystal 22 in order to provide the desired VCO frequency. Essentially, any desired VCO output frequency is provided by iteratively tuning first the N value applied divide-by-N divider 13 and then by iteratively adjusting the digital value applied to D/A 30 until the desired VCO output frequency has substantially been achieved.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method of tuning a voltage control oscillator of a frequency synthesizer to a desired frequency, comprising the steps of:

coarse tuning the frequency synthesizer by adjusting a divisor of a loop divider until its output frequency is close to the desired frequency;

then adjusting a crystal reference oscillator to produce the desired frequency;

providing a memory with an associated microprocessor; and storing the coarse and desired frequencies in said memory.

2. A method of programming an output frequency of a synthesized radio comprising the steps of:

coarse tuning the synthesized radio by changing a divisor of a loop divider;

fine tuning the synthesized radio by warping a loop reference oscillator;

providing a memory with an associated microprocessor; and storing the coarse and fine tuning values in said memory.

3. A method of programming the operating frequency of the synthesized radio as defined in claim 2, comprising the further steps of: repeating the steps of claim 2 to coarse and fine tune the synthesized radio for at least a second frequency; and and storing the coarse and fine tuning values for the second frequency.

4. A method of programming a synthesizer comprising the steps of:

operating a controller to provide "N" values to a divide-by-N divider;

selecting a value of "N" that approximately provides a desired output frequency;

operating the controller to provide digital values corresponding to analog voltage values;

applying the analog voltage values to a tunable loop reference oscillator to warp the oscillator frequency;

selecting a digital value that corresponds to desired loop output frequency;

providing a with an associated microprocessor; and storing the approximate and desired frequencies in said memory.

* * * * *